United States Patent
Tran

Patent Number: 5,990,558
Date of Patent: Nov. 23, 1999

[54] REDUCED CRACKING IN GAP FILLING DIELECTRICS

[75] Inventor: Khanh Tran, San Jose, Calif.

[73] Assignee: Advanced Micro Devices, Inc., Sunnyvale, Calif.

[21] Appl. No.: 08/993,050

[22] Filed: Dec. 18, 1997

[51] Int. Cl.[6] .................................................. H01L 23/52
[52] U.S. Cl. ........................ 257/759; 257/760; 438/623; 438/624; 438/697
[58] Field of Search .................................... 438/624, 623, 438/694, 780, 697; 257/759, 760

[56] References Cited

U.S. PATENT DOCUMENTS

| | | |
|---|---|---|
| 5,486,493 | 1/1996 | Jeng . |
| 5,527,737 | 6/1996 | Jeng . |
| 5,591,677 | 1/1997 | Jeng . |
| 5,728,628 | 3/1998 | Havemann ................ 438/668 |

*Primary Examiner*—Caridad Everhart

[57] ABSTRACT

Cracking of gap fill dielectric material in open fields bordering a dense array of conductive features on subsequent thermal processing is significantly reduced or avoided by etching to remove all or a portion of the dielectric material in the open field except for sidewall spacers on bordering metal features. Embodiments also include removing dielectric material from an upper surface of a metal feature having a surface area in excess of about 100 microns$^2$ to avoid cracking on subsequent thermal processing. An oxide, such as silicon oxide derive from TEOS or silane is deposited and planarized, as by CMP. Embodiments include employing HSQ as a low dielectric constant gap fill material.

27 Claims, 2 Drawing Sheets

REDUCED CRACKING IN GAP FILLING DIELECTRICS

TECHNICAL FIELD

The present invention relates to a semiconductor device and method of manufacturing the semiconductor device having a low RC time constant and high reliability. The present invention has particular applicability in manufacturing high density multi-metal layer semiconductor devices with design features of 0.25 microns and under.

BACKGROUND ART

The escalating demands for high densification and performance associated with ultra large scale integration semiconductor devices require design features of 0.25 microns and under, such as about 0.18 microns, increased transistor and circuit speeds, high reliability and increased production throughput with a low rejection rate for competitiveness in the market place. The reduction of design features to 0.25 microns and under generates numerous problems challenging the limitations of conventional interconnection technology, including conventional photolithographic, etching and deposition techniques.

Conventional methodology for forming patterned metal layers comprises a subtractive etching or etch back step as the primary metal patterning technique. Such a method involves the formation of a first dielectric interlayer on a semiconductor substrate, such as doped monocrystalline silicon, with conductive contacts formed therein for electrical connection with an active region on the semiconductor substrate, such as a source/drain region. A metal layer is deposited on the first dielectric layer. The metal layer is typically formed as a composite structure comprising sequentially deposited layers of titanium or tungsten, a primary conductive metal layer, such as aluminum or an aluminum alloy, and an upper anti-reflective coating, such as titanium nitride. A photoresist mask is then formed on the metal layer. The photoresist mask typically comprises a pattern of openings corresponding to various patterns consistent with circuit design. Such patterns typically include one or more dense arrays of metal features, such as conductive lines, spaced apart by gaps. Such a dense array of metal features is typically separated from an isolated metal feature or another dense array of metal features by a greater distance than the gap dimension separating the metal features within the particular dense array. For example, metal features in a dense array are typically spaced apart by a distance less than about 1 micron, e.g., about 0.375 microns for metal features of about 0.50 microns; whereas, an open field generally extends a distance greater than about 1 micron, such as greater than about 1.5 microns, e.g., greater than about 2 microns. A dielectric material, such as spin on glass (SOG), is typically deposited to fill in the gaps between the metal features, and baked at a temperature of about 300° C. to about 450° C. for a period of time up to about two hours, depending upon the particular SOG material employed. Planarization, as by chemical-mechanical polishing (CMP), is then performed.

Although semiconductor devices are being scaled in the horizontal direction, they are not generally scaled in the vertical dimension, since scaling in both dimensions would lead to a higher current density and that could exceed reliability limits. Horizontal scaling, therefore, requires conductive lines having a high aspect ratio, i.e., conductor height to conductive width of greater than 1, with reduced interwiring spacings. As a result, capacitive coupling between conductive lines becomes a primary limitation on circuit speed. If intrametal capacitance is high, the possibility for electric inefficiencies and inaccuracies increases. It is recognized that a reduction in capacitance within multi-level metallization systems will reduce the RC time constant between the conductive lines.

Various dielectric materials having a relatively low dielectric constant, e.g., a dielectric constant of less than about 4, have been proposed. One such dielectric material, hydrogen silsesquioxane (HSQ) offers many advantages for use in interconnect technology. HSQ is relatively carbon free, thereby rendering it unnecessary to etch back HSQ below the upper surface of the metal lines to avoid po-son via problems. In addition, HSQ exhibits excellent planarity and is capable of gap filling interwiring spacings less than 0.15 microns employing conventional spin-on equipment. HSQ undergoes a melting phase at approximately 200° C. and it does not convert to the high dielectric constant glass phase until reaching temperatures of about 400° C. in intermetal applications. As-deposited HSQ is considered a relatively low dielectric constant material with a dielectric constant of about 2.9–3.0, vis-à-vis silicon dioxide grown by thermal oxidation or chemical vapor deposition technique which has a dielectric constant of about 3.9–4.2. The mentioned dielectric constants are based on a scale wherein 1.0 represents the dielectric constant of air.

However, in attempting to employ various dielectric materials, particularly low dielectric constant materials such as HSQ, for gap filling, it was found that cracking typically occurs during subsequent thermal processing in fabricating the semiconductor device. Such subsequent thermal processing includes chemical vapor deposition of a planarizing oxide, such as a silicon dioxide derived from tetraethyl orthosilicate (TEOS) by plasma enhanced chemical vapor deposition (PECVD) or silicon dioxide derived from silane by PECVD. Gap fill dielectric cracking actually causes a deposited film to lift off of the metal features, thereby adversely impacting device reliability and increasing the rejection rate.

Accordingly, there exists a need for semiconductor methodology enabling the use of low dielectric constant dielectric materials, such as HSQ, for gap filling a patterned metal layer without cracking upon subsequent processing.

DISCLOSURE OF THE INVENTION

An object of the present invention is a method of manufacturing a high density semiconductor device with design features of 0.25 microns and under, employing a low dielectric constant material, such as HSQ, for gap filling, with high reliability.

Additional objects, advantages and other features of the present invention will be set forth in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a method of manufacturing a semiconductor device, which method comprises: forminc a first dielectric layer; forming a patterned conductive layer on the first dielectric layer, the patterned conductive layer comprising a dense array of first conductive features spaced apart by gaps and having a first leading or trailing conductive feature; and a second conductive feature spaced apart from the first leading or trailing conductive feature by an open field; depositing a layer of dielectric material on the patterned conductive layer to fill in the gaps and open field; and etching to remove a sufficient amount of dielectric material from the open field to reduce or avoid cracking of the dielectric material between the first leading or trailing conductive feature and second conductive feature during any subsequent processing at elevated temperatures; and/or etching to remove a sufficient amount of dielectric material from an upper surface of the second metal feature to reduce or avoid cracking of the dielectric material thereon during any subsequent processing at elevated temperatures.

Another aspect of the present invention is a semiconductor device, comprising: a first dielectric layer; a patterned metal layer on the first dielectric layer, the patterned metal layer comprising a dense array of first metal features having gaps therebetween and a first leading or trailing metal feature spaced apart from a second metal feature by an open field; a layer of hydrogen silsesquioxane (HSQ) formed on the patterned metal layer filling the gaps and forming a sidewall spacer on the side surface of the first leading or trailing metal feature and second metal feature bordering the open field; and any HSQ in the open field, apart from the sidewall spacers, has a thickness no greater than about 5,000 Å.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

The present invention enables the use of dielectric materials, such as low dielectric materials, e.g., HSQ, for gap filling patterned metal layers comprising a dense array of metal features having a leading and/or trailing metal feature spaced apart by an open field from another metal feature which can be an isolated metal feature or a trailing or leading metal feature of another dense array of metal features. As used throughout this application, the term "dense array" denotes a plurality of metal features spaced apart by a distance less than about 1 micron, while the expression "open field" denotes a distance greater than about 1 micron.

Figure 1:
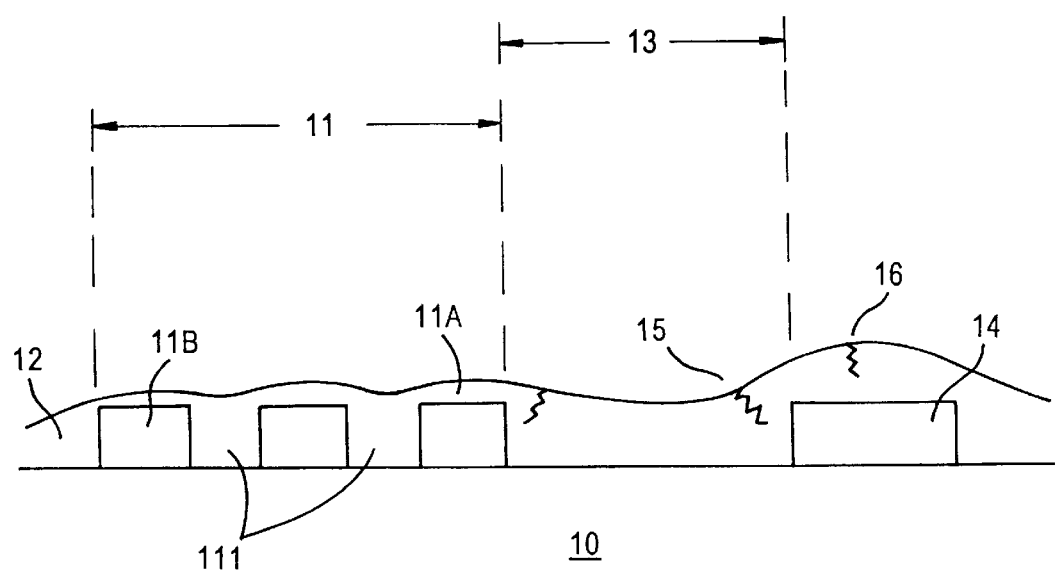
FIG. 1 schematically depicts HSQ cracking.

Adverting to FIG. 1, a metal layer is deposited on dielectric layer 10 and patterned, employing a conventional photoresist mask containing openings defining various conductive patterns and conductive features. The metal layer is typically a composite comprising a first refractory metal layer such as tungsten or a titanium, an intermediate primary metal layer such as aluminum or an aluminum alloy and an upper anti-reflective coating such as titanium nitride. As shown in FIG. 1, the patterned metal layer comprises a dense array 11 of closely spaced apart metal features, such as metal lines, a leading metal feature 11A and a trailing metal feature 11B. The metal features within the dense array 11 are spaced apart by gaps 111. Typically, gaps 111 are less than about 1 micron, e.g., less than about 0.5 microns, such as about 0.375 microns for a feature size of about 0.50 microns. The etched conductive pattern also comprises a second conductive feature 14, such as an isolated metal feature or a trailing metal feature of another dense array of metal lines. For illustrative convenience, second metal feature is depicted as spaced apart from leading metal feature 11A. However, the conductive pattern may comprise various spaced apart metal features.

As illustrated in FIG. 1, the second metal feature 14 comprises an isolated metal feature having a width substantially greater than the width of the metal features within the dense array 11. The leading metal feature 11A is spaced apart from the second metal feature 14 by what is referred to as an open field 13 extending a distance greater than the gap distance. Open field 13 extends a distance greater than 1 micron, typically greater than about 1.5 microns, e.g., greater than about 2 microns.

It has been found that during subsequent thermal processing, cracking occurs in various dielectric gap fill materials, particularly low dielectric constant materials, such as HSQ, in regions wherein it is deposited at a relatively high thickness, e.g., greater than about 5,000 Å for HSQ. Such cracking typically occurs in high stress areas, such as open fields bordering metal features, as indicated by reference numeral 15. It has also been observed that such cracking occurs on an upper surface of a metal feature, such as second metal feature 14, wherein the HSQ deposited on the second metal feature is substantially thick, as typically encountered on metal features having an upper surface area in excess of about 100 microns$^2$.

Dielectric gap fill cracking typically occurs upon subsequent thermal processing, as when depositing a planarizing oxide layer, such as silicon dioxide derived from TEOS or silane by PECVD at a temperature greater than about 400° C. e.g., about 430° C. to about 450° C.

The present invention addresses and solves such cracking problems, thereby enabling the use of dielectric materials having a dielectric constant less than about 4, such as HSQ, for gap filling with high reliability and an attendant reduction in the RC time constant.

In an embodiment of the present invention, a gap filling layer of HSQ is deposited, as by a spin on technique. A mask, e.g., photomask, is then formed on the deposited HSQ layer. The photomask comprises openings strategically placed over open fields wherein HSQ is deposited at a thickness of about 5,000 Å or greater and/or over metal features having an upper surface area of about 100 microns$^2$ or greater. Etching is then conducted to remove HSQ from the open field leaving HSQ in the open field at a thickness no greater than 5,000 Å, and forming HSQ sidewall spacers on the side surfaces of the metal features bordering the open field. Embodiments of the present invention include removing HSQ substantially entirely from the open field leaving the HSQ sidewall spacers on the side surfaces of the metal features bordering the open field, thereby avoiding etching damage to the metal features. In addition, the thickness of HSQ deposited on metal features having an upper surface area greater than about 100 microns$^2$ is reduced a sufficient amount to avoid cracking, e.g., reduced to a thickness of less than about 0.25 microns. It should be noted that most cracking occurs when one or both dimensions of the metal feature is about 5 microns or greater.

After strategic etching in accordance with embodiments of the present invention, the photoresist mask is removed, and processing is continued in a conventional manner as by depositing of an oxide, such as a silicon oxide derived from TEOS or silane by PECVD. After oxide deposition, planarization is implemented as by CMP, to provide a substantially planarized surface for subsequent photolithographic techniques.

Figure 2:
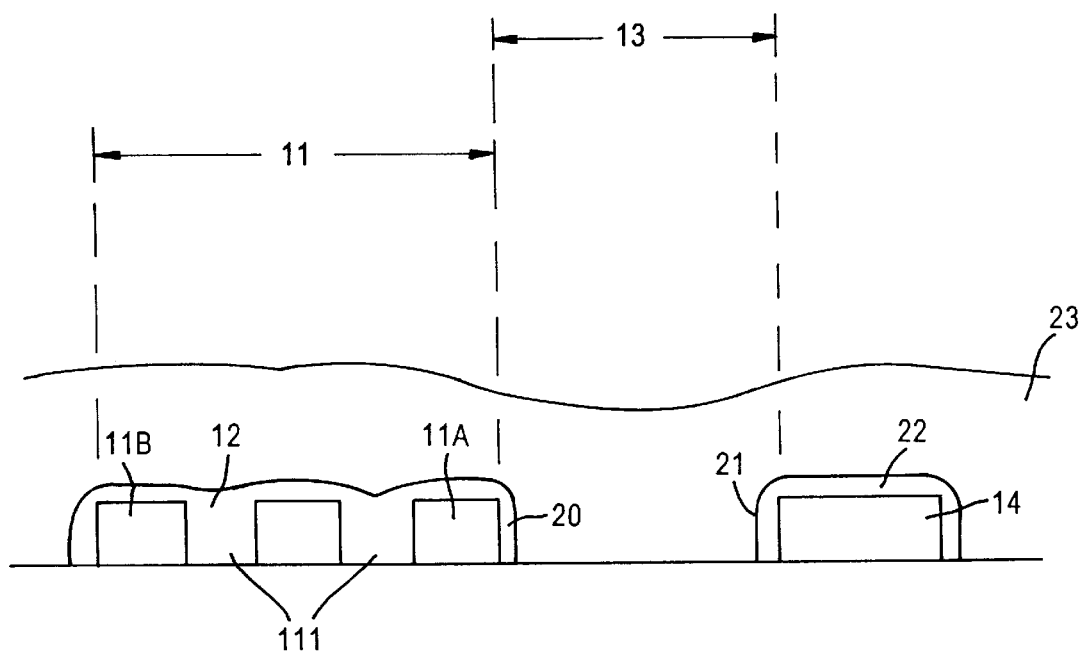
FIG. 2 schematically illustrates an embodiment of the present invention.

An embodiment of the present invention is illustrative in FIG. 2, wherein features similar to those in FIG. 1 bear similar reference numerals. Adverting to FIG. 2, dense array 11 of metal features formed on dielectric layer 10 is characterized by leading metal feature 11A, trailing metal feature 11B, and gaps 111 therebetween. The leading metal feature 11A is spaced apart from second metal feature 14 by open field 13. Second metal feature 14 has an upper surface area of about 100 microns$^2$ or greater. In accordance with the present invention, a layer of the dielectric material 12, such as a low dielectric constant material, e.g., HSQ, is deposited for gap filling as in a manner similar to that depicted in FIG. 1.

In accordance with embodiments of the present invention, after depositing HSQ layer 12, a photoresist mask is formed on the as-deposited HSQ layer. The photoresist mask comprises strategically positioned openings positioned above open field 13 as well as on metal features having an upper surface area of 100 microns$^2$ or greater, such as metal feature 14 (FIG. 2). Etching is then conducted, employing a conventional oxide anisotropic etch, to remove HSQ within open field 13 as well as on the upper surface of metal features having an upper surface area of about 100 microns$^2$ or greater, such as metal feature 14.

Etching of the open field is conducted to form a sidewall spacer 23 on a side surface of the leading metal feature 11A of dense array 11 which borders open field 13 and to form a sidewall spacer 21 on a side surface of metal feature 14 bordering open field 13. A sufficient amount of HSQ is removed by etching from the open field as well as from the upper surface metal feature 14 to avoid cracking during subsequent thermal processing. In a particular situation, depending upon the particular geometry, the amount of HSQ removed to avoid cracking upon subsequent thermal processing can be determined by routine experimentation. For example, it has been found that wherein the open field exceeds about 1 micron, it is sufficient to remove HSQ from the open field leaving HSQ at a thickness no greater than about 5,000 Å. Embodiments of the present invention, however, comprise removing substantially all of the HSQ from the open field, leaving only sidewall spacers 20 and 21 as depicted in FIG. 2. Embodiments of the present invention also include removing HSQ from the upper surface of metal features having an upper surface area of about 100 microns$^2$ or greater, such as metal feature 14, leaving a layer of HSQ 22 thereon substantially at the same as the thickness as sidewall spacer 21, e.g., less than about 0.25 microns.

Subsequent to etching in accordance with the present invention, the photoresist mask is removed in a conventional manner, and an oxide layer 23 is deposited, e.g., silicon oxide derived from TEOS or silane by PECVD. Planarization is then conducted in a conventional manner, as by CMP. Subsequent processing is performed in accordance with the conventional practices.

Adverting to FIG. 2, for illustrative convenience, metal feature 14 having an upper surface area of about 100 microns$^2$ or greater is shown spaced apart from leading metal feature 11A by open field 13. However, a metal feature having an upper surface area of about 100 microns$^2$ or greater, can also be spaced apart from trailing metal feature 11B and, in such case, an appropriate opening would be provided in the photoresist mask for removing HSQ deposited on such metal feature and in the bordering open field. Also for illustrative convenience, metal feature 14 has been illustrated as an isolated metal feature. However, metal feature 14 can comprise a trailing metal feature of another dense array of metal features having an upper surface area substantially the same as that of metal feature 11A and less than about 100 microns$^2$, in which case it may not be necessary to reduce the thickness of HSQ deposited thereon to avoid cracking during subsequent thermal processing. It should be understood that trailing metal feature 11B can be spaced apart from a leading metal feature, not shown, of another dense array or another isolated metal feature.

The present invention is applicable to the production of various types of semiconductor devices, particularly high density, multi-metal layered semiconductor devices with submicron features, particularly submicron features of about 0.25 microns and under, exhibiting high speed characteristics and improved reliability. The present invention enables the advantageous use of various dielectric materials, particularly low dielectric constant materials, such as HSQ, to gap fill patterned metal layers without encountering undesirable cracking upon subsequent thermal processing. The present invention is cost effective and can be easily integrated into conventional processing equipment resulting in reduced manufacturing costs and high production throughput.

In carrying out the embodiments of the present invention, the metal layers can be formed of any metal layers typically employed in the manufacture of semiconductor devices, such as aluminum, aluminum alloys, copper, copper alloys, gold, gold alloys, silver, silver alloys, refractory metals, refractory metal alloys, and refractory metal compounds. The metal layers of the present invention can be formed by any technique conventionally employed in the manufacture of semiconductor devices. For example, the metal layers can be formed by conventional metallization techniques, such as various types of chemical vapor deposition (CVD) processes, including low pressure chemical vapor deposition (LPCVE), and PECVD. Normally, when high melting metal point metals such as tungsten are deposited, CVD techniques are employed. Low melting point metals, such as aluminum and aluminum alloys, including aluminum-copper alloys, can also be deposited by melting, sputtering, or other physical vapor deposition (PVD) techniques.

In the previous descriptions, numerous specific details are set forth, such as specific materials, structures, chemicals, processes, parameters, etc., in order to provide a thorough understanding of the present invention. However, the present invention can be practiced without resorting to the details specifically set forth. In other instances, well known processing structures have not been described in detail in order not to unnecessarily obscure the present invention.

Only the preferred embodiment of the invention and an example of its versatility are shown and described in the present disclosure. It is to be understood that the invention is capable of use in various other combinations and environments and is capable of changes or modifications within the scope of the inventive concept as expressed herein.

What is claimed is:
1. A method of manufacturing a semiconductor device, which method comprises:
   forming a first dielectric layer;
   forming a patterned conductive layer on the first dielectric layer, the patterned conductive layer comprising:

a dense array of first conductive features spaced apart by gaps and having a first leading or trailing conductive feature; and a second conductive feature spaced apart from the first leading or trailing conductive feature by an open field;

depositing a layer of dielectric material on the patterned conductive layer to fill in the gaps and open field;

etching to remove a sufficient amount of dielectric material from the open field to reduce or avoid cracking of the dielectric material between the first leading or trailing conductive feature and second conductive feature during any subsequent processing at elevated temperatures leaving a layer of the dielectric material on upper surfaces of the first conductive features; and/or etching to remove a sufficient amount of dielectric material from an upper surface of the second conductive feature to reduce or avoid cracking of the dielectric material thereon during any subsequent processing at elevated temperature leaving a layer of dielectric material on the upper surface of the second conductive feature.

2. The method according to claim 1, wherein the dielectric material has a dielectric constant less than about 4.

3. The method according to claim 2, wherein the dielectric material comprises hydrogen silsesquioxane (HSQ) and the conductive lay er comprises a metal, the first conductive features comprise first metal features and the second conductive feature comprises a second metal feature.

4. The method according to claim 3, comprising:

forming a mask on the deposited HSQ, which mask has an opening over the open field and/or over the second conductive feature; and etching through the mask to remove the sufficient amount of dielectric material from the open field and/or from the upper surface of the second conductive feature.

5. The method according to claim 4, wherein:

the first metal features are spaced apart by gaps no greater than about 1 micron; and the open field extends a distance greater than about 1 micron.

6. The method according to claim 5, further comprising:

depositing an oxide layer after etching; and planarizing by the deposited oxide chemical-mechanical polishing.

7. The method according to claim 6, wherein the oxide comprises silicon dioxide derived from tetraethyl orthosilicate or silane by plasma enhanced chemical vapor deposition.

8. The method according to claim 5, wherein the open field extends a distance greater than about 1.5 microns.

9. The method according to claim 8, wherein the open field extends a distance greater than about 2 microns.

10. The method according to claim 4, comprising:

etching to remove HSQ from the open field leaving a layer of HSQ having a thickness no greater than 5,000 Å; and/or etching to remove HSQ from the upper surface of the second metal feature leaving a layer of HSQ thereon having a thickness no greater than 0.25 microns.

11. The method according to claim 10, comprising etching to remove HSQ from the open field, leaving a layer of HSO on the upper surfaces of the first metal features and an HSQ sidewall spacer, having a thickness up to about 0.25 microns, on side surfaces of the first leading or trailing metal feature and second metal feature bordering the open field.

12. The method according to claim 11, comprising etching to remove substantially all of the HSQ from the open field on the first dielectric layer leaving the sidewall spacers.

13. The method according to claim 3, comprising depositing the layer of HSQ by a spin on technique.

14. The method according to claim 3, wherein the second metal feature is a second trailing or leading metal feature of a dense array of second metal features.

15. The method according to claim 11, wherein the first metal features are spaced apart by gaps no greater than about 1 micron and the open field extends a distance greater than about 1 micron.

16. The method according to claim 15, wherein the first metal features are no greater than about 0.50 microns and are spaced apart by a gap no greater than about 0.375 microns.

17. The method according to claim 15, further comprising depositing an oxide layer on the etched HSQ and planarizing by CMP.

18. The method according to claim 3, wherein the second metal feature has an upper surface area of about 100 microns$^2$ or more, and etching to remove HSQ from the open field and from the upper surface of the second metal feature.

19. A semiconductor device, comprising:

a first dielectric layer;

a patterned metal layer on the first dielectric layer, the patterned metal layer comprising a dense array of first metal features having gaps therebetween and a first leading or trailing metal feature spaced apart from a second metal feature by an open field, each first metal feature having an upper surface and side surfaces;

a layer of hydrogen silsesquioxane (HSQ) formed on the upper surfaces of the first metal features filling the gaps and forming a sidewall spacer on the side surfaces of the first leading or trailing metal feature and second metal feature bordering the open field; and any HSQ in the open field, apart from the sidewall spacers, has a thickness no greater than about 5,000 Å.

20. The semiconductor device according to claim 19, with substantially no HSQ in the open field apart from the sidewall spacers.

21. The semiconductor device according to claim 19, further comprising a planarized oxide layer on the HSQ.

22. The semiconductor device according to claim 20, further comprising a planarized oxide layer on the HSQ and open field.

23. The semiconductor device according to claim 21, wherein the first metal features are spaced apart by gaps no greater than about 1 micron and the open field extends a distance greater than about 1 micron.

24. The semiconductor device according to claim 23, wherein the open field extends a distance of about 1.5 microns.

25. The semiconductor device according to claim 24, wherein the open field extends a distance of about 2 microns.

26. The semiconductor device according to claim 19, wherein HSQ remaining on an upper surface of the second metal feature has a thickness no greater than about 0.25 microns.

27. The semiconductor device according to claim 26, wherein the second metal feature has an upper surface area of about 100 microns$^2$ or greater.

* * * * *

UNITED STATES PATENT AND TRADEMARK OFFICE
CERTIFICATE OF CORRECTION

PATENT NO.   : 5,990,558
DATED         : November 23, 1999
INVENTOR(S)  : Khanh Tran It is certified that error appears in the above-identified patent and that said Letters Patent is hereby corrected as shown below:

<u>Column 7, claim 11,</u>
Line 64, replace the abbreviation "HSO" with -- HSQ -- .

Signed and Sealed this

Fourth Day of September, 2001

*Attest:*

*Attesting Officer*

NICHOLAS P. GODICI
*Acting Director of the United States Patent and Trademark Office*